United States Patent
Zhang et al.

(10) Patent No.: US 9,841,649 B2
(45) Date of Patent: Dec. 12, 2017

(54) GATE DRIVER ON ARRAY SHORT-CIRCUIT PROTECTION CIRCUIT AND LIQUID CRYSTAL PANEL INCLUDING THE SAME

(71) Applicant: Shenzhen China Star Optoelectronics Technology Co., Ltd., Shenzhen, Guangdong (CN)

(72) Inventors: Xianming Zhang, Guangdong (CN); Dan Cao, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 129 days.

(21) Appl. No.: 14/917,017

(22) PCT Filed: Aug. 14, 2015

(86) PCT No.: PCT/CN2015/087077
§ 371 (c)(1),
(2) Date: Mar. 6, 2016

(87) PCT Pub. No.: WO2017/024601
PCT Pub. Date: Feb. 16, 2017

(65) Prior Publication Data
US 2017/0168359 A1    Jun. 15, 2017

(30) Foreign Application Priority Data
Aug. 7, 2015   (CN) .......................... 2015 1 0478474

(51) Int. Cl.
*G06F 3/038* (2013.01)
*G02F 1/1362* (2006.01)
(Continued)

(52) U.S. Cl.
CPC .... *G02F 1/136204* (2013.01); *G02F 1/13454* (2013.01); *G09G 3/20* (2013.01);
(Continued)

(58) Field of Classification Search
CPC ........... G02F 1/136204; G02F 1/13454; H01L 23/50; H01L 23/5286; H01L 27/1244;
(Continued)

(56) References Cited

U.S. PATENT DOCUMENTS

2006/0132417 A1* 6/2006 Shigenobu ........... G09G 3/3696
345/98
2007/0257645 A1* 11/2007 Nishino .................. H02M 1/32
323/276
(Continued)

*Primary Examiner* — Rodney Amadiz
(74) *Attorney, Agent, or Firm* — Andrew C. Cheng

(57) ABSTRACT

The short-circuit protection circuit for a Gate Driver on Array (GOA) liquid crystal panel contains a power module, a first booster module, a feedback module, and a second booster module series-connected in the this order. A control module is electrically connected to the first booster, feedback, and second booster modules. The power module provides a power voltage. The control module provides a pulse width modulation (PWM) signal so as to control the first and second booster modules to transform the power voltage into driving voltage. The feedback module extracts a feedback current from a current flowing from the first to the second booster module and provides a feedback signal to the control module. When the feedback current exceeds a current threshold, the control module cuts off the PWM signal output so as to achieve short-circuit protection. A liquid crystal panel incorporating the above short-circuit protection circuit is also provided.

18 Claims, 1 Drawing Sheet

(51) Int. Cl.

| | |
|---|---|
| *G02F 1/1345* | (2006.01) |
| *G09G 3/36* | (2006.01) |
| *H01L 23/50* | (2006.01) |
| *H01L 23/528* | (2006.01) |
| *H01L 27/02* | (2006.01) |
| *H01L 27/12* | (2006.01) |
| *H03K 17/082* | (2006.01) |
| *G09G 3/20* | (2006.01) |

(52) U.S. Cl.
CPC ......... *G09G 3/3674* (2013.01); *G09G 3/3677* (2013.01); *H01L 23/50* (2013.01); *H01L 23/5286* (2013.01); *H01L 27/0255* (2013.01); *H01L 27/0259* (2013.01); *H01L 27/0288* (2013.01); *H01L 27/0292* (2013.01); *H01L 27/1244* (2013.01); *H03K 17/082* (2013.01); *G09G 2300/0408* (2013.01); *G09G 2300/0871* (2013.01); *G09G 2310/08* (2013.01); *G09G 2330/04* (2013.01); *G09G 2330/045* (2013.01)

(58) Field of Classification Search
CPC ............. H01L 27/0255; H01L 27/0259; H01L 27/0288; H01L 27/0292; G09G 3/20; G09G 3/3677; G09G 3/3674; G09G 2330/045; G09G 2300/0871; G09G 2300/0408; H03K 17/082
See application file for complete search history.

(56) References Cited

U.S. PATENT DOCUMENTS

| | | | |
|---|---|---|---|
| 2013/0057529 A1* | 3/2013 | Lee ....................... | H02J 7/0065 345/211 |
| 2014/0062846 A1* | 3/2014 | Cao ......................... | G09G 3/36 345/92 |
| 2017/0221401 A1* | 8/2017 | Shangguan ............ | G09G 3/006 324/760.02 |

* cited by examiner

GATE DRIVER ON ARRAY SHORT-CIRCUIT PROTECTION CIRCUIT AND LIQUID CRYSTAL PANEL INCLUDING THE SAME

CROSS REFERENCE

This application claims the priority of Chinese Patent Application No. 201510478474.1, entitled "Gate Driver on Array short-circuit protection circuit and liquid crystal panel including the same", filed on Aug. 7, 2015, the disclosure of which is incorporated herein by reference in its entirety.

FIELD OF THE INVENTION

The present disclosure relates to liquid crystal display technologies, and more particularly to a Gate Driver on Array short-circuit protection circuit and a liquid crystal panel including the same.

BACKGROUND OF THE INVENTION

Gate Driver on Array (GOA) is an emerging technique for driving liquid crystal panels where the gate signal driving circuits are directly etched on a liquid crystal panel, thereby saving the cost having a separate gate driver IC and the process of bonding the gate driver IC on the liquid crystal panel. Most importantly, by integrating the gate driver IC with the liquid crystal panel, the liquid crystal panel is thinner, has better resolution, reliability, and vibration resistance. Currently, in a GOA liquid crystal panel, a lever shifter is often used to produce CLK_OUT signal to the liquid crystal panel. However, the CLK_OUT current is usually drawn from the activation voltage VGH of the gate driver IC produced from a PWM chip. Due to some manufacturing process factors such as a plastic frame of the liquid crystal panel not tightly configured, the CLK_OUT output of the level shifter is often short-circuited, causing a significant increase in the CLK_OUT current, burning down the liquid crystal panel, or even a fire.

SUMMARY OF THE INVENTION

The present disclosure therefore provides a Gate Driver on Array (GOA) short-circuit protection circuit so as to prevent excessive output current from burning down a liquid crystal panel when the output terminal of a GOA driving circuit of the liquid crystal panel is short-circuited.

The present disclosure also provides a liquid crystal panel employing the GOA short-circuit protection circuit.

The GOA short-circuit protection circuit, containing a power module, a first booster module, a feedback module, a second booster module, and a control module. The power module, the first booster module, the feedback module, and the second booster module are series-connected in the foregoing order. The control module is electrically connected to the first booster, feedback, and second booster modules, respectively. The power module provides a power voltage. The control module provides a pulse width modulation (PWM) signal so as to control the first and second booster modules to transform the power voltage into a driving voltage. The feedback module extracts a feedback current from a current flowing from the first to the second booster module and provides a feedback signal to the control module. When the feedback current exceeds a current threshold, the control module cuts off the provision of the PWM signal so as to achieve short-circuit protection.

The control module has a feedback signal input terminal. The feedback module contains a transistor having a base, an emitter, and a collector. The base is electrically connected to the feedback signal input terminal. The emitter is electrically connected to the first booster module. The collector is electrically connected to the second booster module.

The control module further has a PWM signal output terminal. The first booster module contains a first diode, a second diode, a first capacitor, and a second capacitor. The first diode has its anode electrically connected to the power module and its cathode electrically connected to the second diode's anode. The second diode has its cathode electrically connected to the emitter. The first capacitor has a first terminal electrically connected to the cathode of the first diode and a second terminal electrically connected to the PWM signal output terminal. The second capacitor has a first terminal electrically connected to the cathode of the second diode and a second terminal electrically connected to ground.

The second booster module contains a third diode, a fourth diode, a third capacitor, a fourth capacitor, and a fifth capacitor. The third diode has its anode electrically connected to the collector and its cathode electrically connected to the fourth diode's anode. The third capacitor has a first terminal electrically connected to the collector and a second terminal electrically connected to ground. The fourth capacitor has a first terminal electrically connected the cathode of the third diode and a second terminal electrically connected to the PWM signal output terminal. The fifth capacitor has a first terminal electrically connected to the cathode of the fourth diode and a second terminal electrically connected to ground.

The PWM signal has a high level state and a low level state. The high level state outputs a high level voltage and the low level state outputs a low level voltage zero; when the PWM signal is at the low level voltage, the first, second, third, and fourth diodes are all conducted, and the first to fifth capacitors are all charged to the power voltage.

When the PWM signal is at the high level voltage, the first capacitor is charged to the high level voltage plus the power voltage, the first diode is turned off, the second diode is conducted, the second and third capacitors are charged to the high level voltage plus the power voltage, the third and fourth diodes are conducted, and the fourth and fifth capacitors are charged to the high level voltage plus the power voltage.

When the PWM signal is at the low level voltage again, the first diode is conducted, the first capacitor drops to the power voltage, the second diode is turned off, the second, third, fourth, and fifth capacitors are maintained at the high level voltage plus the power voltage.

When the PWM signal is at the high level voltage again, the first capacitor is charged to the high level voltage plus the power voltage, the first diode is turned off, the second diode is conducted, the second and third capacitors are maintained at the high level voltage plus the power voltage, the fourth capacitor is charged to the power voltage plus twice the high level voltage, the third diode is turned off, the fourth diode is conducted, and the fifth capacitor is charged to the power voltage plus twice the high level voltage.

The GOA short-circuit protection circuit can further contain a level shifting module having an input terminal and an output terminal. The input terminal is electrically connected to the cathode of the fourth diode. The level shifting module obtains a clock driving signal from the driving voltage and outputs the clock driving signal to the output terminal. When the output terminal is short-circuited, the current flowing through the first and second booster modules, and through the level shifting module is increased, and the feedback current is increased as well. When the control module detects that the feedback current exceeds the current threshold, the control module cuts down the provision of the PWM signal. The first and second booster modules therefore enter a short-circuit protection mode.

The liquid crystal panel contains a GOA short-circuit protection circuit, which contains a power module, a first booster module, a feedback module, a second booster module, and a control module. The power module, the first booster module, the feedback module, and the second booster module are series-connected in the foregoing order. The control module is electrically connected to the first booster, feedback, and second booster modules, respectively. The power module provides a power voltage. The control module provides a PWM signal so as to control the first and second booster modules to transform the power voltage into a driving voltage. The feedback module extracts a feedback current from a current flowing from the first to the second booster module and provides a feedback signal to the control module; when the feedback current exceeds a current threshold, the control module cuts off the provision of the PWM signal so as to achieve short-circuit protection.

The control module has a feedback signal input terminal. The feedback module contains a transistor having a base, an emitter, and a collector. The base is electrically connected to the feedback signal input terminal. The emitter is electrically connected to the first booster module. The collector is electrically connected to the second booster module.

The control module further has a PWM signal output terminal. The first booster module contains a first diode, a second diode, a first capacitor, and a second capacitor. The first diode has its anode electrically connected to the power module and its cathode electrically connected to the second diode's anode. The second diode has its cathode electrically connected to the emitter. The first capacitor has a first terminal electrically connected to the cathode of the first diode and a second terminal electrically connected to the PWM signal output terminal. The second capacitor has a first terminal electrically connected to the cathode of the second diode and a second terminal electrically connected to ground.

The second booster module contains a third diode, a fourth diode, a third capacitor, a fourth capacitor, and a fifth capacitor. The third diode has its anode electrically connected to the collector and its cathode electrically connected to the fourth diode's anode. The third capacitor has a first terminal electrically connected to the collector and a second terminal electrically connected to ground. The fourth capacitor has a first terminal electrically connected the cathode of the third diode and a second terminal electrically connected to the PWM signal output terminal. The fifth capacitor has a first terminal electrically connected to the cathode of the fourth diode and a second terminal electrically connected to ground.

The PWM signal has a high level state and a low level state. The high level state outputs a high level voltage and the low level state outputs a low level voltage zero; when the PWM signal is at the low level voltage, the first, second, third, and fourth diodes are all conducted, and the first to fifth capacitors are all charged to the power voltage.

When the PWM signal is at the high level voltage, the first capacitor is charged to the high level voltage plus the power voltage, the first diode is turned off, the second diode is conducted, the second and third capacitors are charged to the high level voltage plus the power voltage, the third and fourth diodes are conducted, and the fourth and fifth capacitors are charged to the high level voltage plus the power voltage.

When the PWM signal is at the low level voltage again, the first diode is conducted, the first capacitor drops to the power voltage, the second diode is turned off, the second, third, fourth, and fifth capacitors are maintained at the high level voltage plus the power voltage.

When the PWM signal is at the high level voltage again, the first capacitor is charged to the high level voltage plus the power voltage, the first diode is turned off, the second diode is conducted, the second and third capacitors are maintained at the high level voltage plus the power voltage, the fourth capacitor is charged to the power voltage plus twice the high level voltage, the third diode is turned off, the fourth diode is conducted, and the fifth capacitor is charged to the power voltage plus twice the high level voltage.

The GOA short-circuit protection circuit can further contain a level shifting module having an input terminal and an output terminal. The input terminal is electrically connected to the cathode of the fourth diode. The level shifting module obtains a clock driving signal from the driving voltage and outputs the clock driving signal to the output terminal. When the output terminal is short-circuited, the current flowing through the first and second booster modules, and through the level shifting module is increased, and the feedback current is increased as well. When the control module detects that the feedback current exceeds the current threshold, the control module cuts down the provision of the PWM signal. The first and second booster modules therefore enter a short-circuit protection mode.

The short-circuit protection circuit provides a series-connected transistor between the first and second booster modules, and employs a control module to detect the base current of the transistor. When the output terminal of the level shifting module is short-circuited and the output current is increased significantly, the base current would exceed the current threshold, therefore triggering the cut down of the provision of the PWM signal, and as such achieving short-circuit protection. The liquid crystal panel is prevented from burning down due to the output short circuit, enhancing the reliability of the liquid crystal panel.

BRIEF DESCRIPTION OF THE DRAWINGS

In order to more clearly illustrate the embodiments of the present disclosure or prior art, the following figures will be described in the embodiments are briefly introduced. It is obvious that the drawings are merely some embodiments of the present disclosure, those of ordinary skill in this field can obtain other figures according to these figures without paying the premise.

DETAILED DESCRIPTION OF PREFERRED EMBODIMENTS

Embodiments of the present disclosure are described in detail with the technical matters, structural features, achieved objects, and effects with reference to the accompanying drawings as follows. It is clear that the described embodiments are part of embodiments of the present disclosure, but not all embodiments. Based on the embodiments of the present disclosure, all other embodiments to those of ordinary skill in the premise of no creative efforts obtained, should be considered within the scope of protection of the present disclosure.

It should be understood that, when an element is said to "connected" or "electrically connected" to another element, the two components can be directly connected or there can be some intermediate element in-between. Specifically, the terminologies in the embodiments of the present disclosure are merely for describing the purpose of the certain embodiment, but not to limit the disclosure. Examples and the appended claims be implemented in the present disclosure requires the use of the singular form of the book "an", "the" and "the" are intended to include most forms unless the context clearly dictates otherwise. It should also be understood that the terminology used herein that "and/or" means and includes any or all possible combinations of one or more of the associated listed items.

Figure 1:
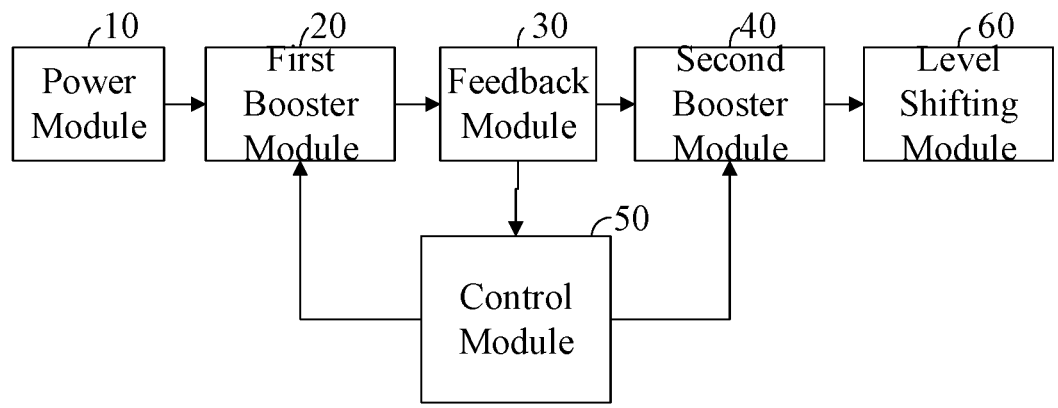
FIG. 1 is a functional block diagram showing a Gate Driver on Array (GOA) short-circuit protection circuit according to an embodiment of the present disclosure.

Please refer to FIG. 1. The present disclosure provides a short-circuit protection circuit 100 for application to a Gate Driver on Array (GOA) liquid crystal panel so as to prevent a significant increase of current resulted from the output of a driving circuit being short-circuited and burning down the liquid crystal panel.

The short-circuit protection circuit 100 contains a power module 10, a first booster module 20, a feedback module 30, and a second booster module 40 series-connected in sequence according to the above-described order. The short-circuit protection circuit 100 further contains a control module 50 electrically connected to the first booster module 20, the feedback module 30, and the second booster module 40, respectively. The power module 10 provides a power voltage. The control module 50 provides a pulse width modulation (PWM) signal. The first and second booster modules 20 and 40 transform electrical voltages into driving currents. The feedback module 30 extracts a feedback current from a current flowing from the first booster module 20 to the second booster module 40 and provides a feedback signal to the control module 50. When the feedback current exceeds a current threshold, the control module 50 cuts off the PWM signal output so as to achieve short-circuit protection.

Figure 2:
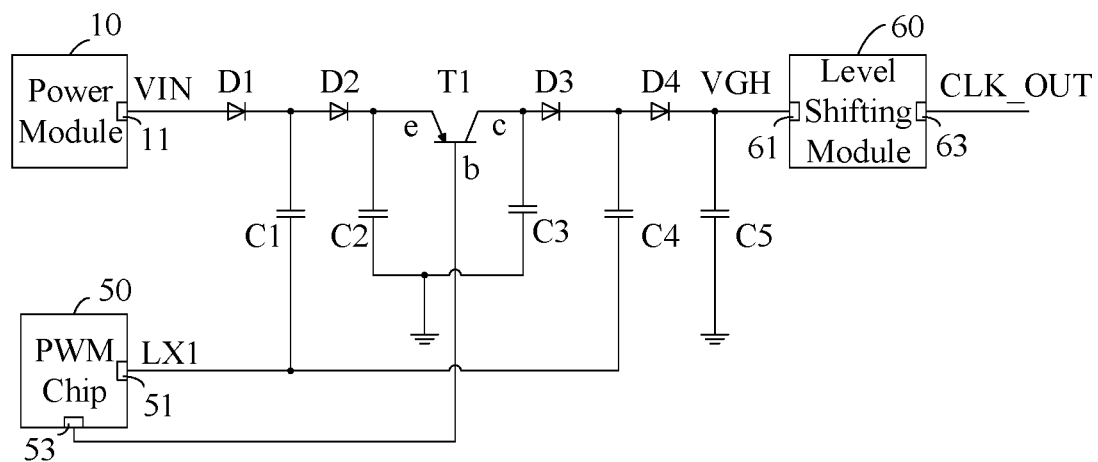
FIG. 2 is a circuit diagram showing the short-circuit protection circuit of FIG. 1.

As illustrated in FIG. 2, in the present embodiment, the power module 10 has a voltage output terminal 11 providing the power voltage VIN. The first and second booster modules 20 and 40 jointly form a driving voltage VGH provision circuit so as to provide activation voltage for Thin Film Transistors (TFTs)(not shown) in the GOA liquid crystal panel. The control module 50 is a PWM chop and contains a PWM signal output terminal 51 and a feedback signal input terminal 53. The PWM signal output terminal 51 provides a PWM signal LX1 controlling the first and second booster modules 20 and 40 to turn the power voltage VIN into the driving voltage VGH. The feedback signal input terminal 53 receives the feedback current from the feedback module 30 which is a PNP-type transistor T1 series-connected between the first and second booster modules 20 and 40 and obtaining the feedback current (If) which is extracted from the current (I) flowing from the first booster module 20 to the second booster module 40.

Specifically, the transistor T1 has a base (b), an emitter (e), and a collector (c). The base is electrically connected to the feedback signal input terminal 53, the emitter is electrically connected to the first booster module 20, and the collector (c) is electrically connected to the second booster module 40. It should be understood that the current flowing through the emitter (e) and the collector (c) of the transistor T1 is the above-mentioned current (I) flowing from the first booster module 20 to the second booster module 40, and the current flowing through the emitter (e) and the base (b) is the above-mentioned feedback current (If). If the transistor T1 provides an amplification of N times, then the feedback current (If) is 1/N of the current (I).

In the present embodiment, if the transistor T1 provides an amplification of 100 times, and the above-mentioned VGH provision circuit has an output current normally 50 mA, the feedback current would be 0.5 mA. If the output of the driving circuit of the GOA liquid crystal panel is short-circuited, and the output current of the VGH provision circuit is increased to 150 mA, the feedback current would be 1.5 mA. Then, by setting the current threshold to be 1 mA, the PWM chip would detect that the 1.5-mA feedback current exceeds the 1-mA current threshold, thereby triggering the PWM chip short-circuit protection mechanism and cutting down the output of the PWM signal, and the first and second booster modules 20 and 40 enter a short-circuit protection mode. It should be understood that the current threshold can be a fixed one in accordance with the driving characteristic of the liquid crystal panel, or the current threshold can be adjustable through a register.

In an alternative embodiment, the first booster module 20 contains a first diode D1, a second diode D2, a first capacitor C1, and a second capacitor C2. The first diode D1 has its anode connected to the voltage output terminal 11 of the power module 10, and its cathode connected to the second diode D2's anode. The second diode D2 in turn has its cathode connected to the emitter (e). The first capacitor C1 has a first terminal connected to the cathode of the first diode D1 and a second terminal connected to the PWM signal output terminal 51. The second capacitor C2 has a first terminal connected to the cathode of the second diode D2 and a second terminal connected to ground.

In an alternative embodiment, the second booster module 40 contains a third diode D3, a fourth diode D4, a third capacitor C3, a fourth capacitor C4, and a fifth capacitor C5. The third diode D3 has its anode connected to the collector (c) and its cathode connected to the fourth diode D4's anode. The third capacitor C3 has a first terminal connected to the collector (c) and a second terminal connected to ground. The fourth capacitor C4 has a first terminal connected the cathode of the third diode D3 and a second terminal connected to the PWM signal output terminal 51. The fifth capacitor C5 has a first terminal connected to the cathode of the fourth diode D4 and a second terminal connected to ground.

In the present embodiment, the first and second booster modules 20 and 40 are a first charge pump and a second charge pump of the VGH provision circuit, respectively. The PWM signal output terminal 51 provides the PWM signal LX1 of a specific duty cycle. Under the control of the PWM signal LX1, the first and second booster modules 20 and 40 transform the power voltage VIN into the driving voltage VGH so as to provide activation voltage for TFTs (not shown) in the liquid crystal panel's driving circuit. Specifically, if the PWM signal LX1 has a high level voltage V1 and a low level voltage 0, the first, second, third, and fourth diodes D1, D2, D3, and D4 are all conducted and the first to fifth capacitors C1 to C5 are all charged up to the power voltage VIN when the PWM signal LX1 is at the low level. On the other hand, when the PWM signal LX1 is at the high level, the first capacitor C1 is charged up to V1+VIN, the first diode D1 is turned off, the second diode D2 is conducted, the second and third capacitors C2 and C3 are charged up to V1+VIN, the third and fourth diodes D3 and D4 are conducted, and the fourth and fifth capacitors C4 and C5 are charged to V1+VIN. When the PWM signal LX1 is at the low level again, the first diode D1 is conducted, the first capacitor C1 drops to VIN, the second diode D2 is turned off, the second, third, fourth, and fifth capacitors C2 to C5 are maintained at V1+VIN. When the PWM signal LX1 is at the high level again, the first capacitor C1 is charged to V1+VIN, the first diode D1 is turned off, the second diode D2 is conducted, the second and third capacitors C2 and C3 are maintained at V1+VIN, the fourth capacitor C4 is charged to V1+VIN+V1, the third diode D3 is turned off, the fourth diode D4 is conducted, and the fifth capacitor C5 is charged to V1+VIN+V1, thereby achieving the boost of the driving voltage to V1+VIN+V1.

In an alternative embodiment, the short-circuit protection circuit 100 can further contains a level shifting module 60 connected to the second booster module 40, thereby obtaining the clock driving signal CLK_OUT from the driving voltage VGH for the liquid crystal panel.

The level shifting module 60 contains an input terminal 61 and an output terminal 63. The input terminal 61 is connected to the cathode of the fourth diode D4. The level shifting module 60 obtains the clock driving signal CLK_OUT from the driving voltage VGH and outputs to the output terminal 63 for the liquid crystal panel. When the output terminal 63 is short-circuited, the current (I) flowing through the first and second booster modules 20 and 40, and through the level shifting module 60 is increased, and the feedback current (If) is increased as well. When the control module 50 detects that the feedback current (If) exceeds the current threshold, the control module 50 cuts down the provision of the PWM signal. The first and second booster modules 20 and 40 therefore enter a short-circuit protection mode, preventing an excessive output current on the output terminal 63 to burn down the liquid crystal panel.

The present disclosure also provides a liquid crystal panel containing a short-circuit protection circuit so as to prevent the liquid crystal panel from burning down due to the short circuit of the output terminal of the driving circuit and a significant increase in the output current, burning down, due to some manufacturing process factors such as a plastic frame of the liquid crystal panel not tightly configured. The short-circuit protection circuit is described above, along with FIGS. 1 and 2 and the details therefore are omitted here.

The short-circuit protection circuit provides a series-connected transistor between the first and second booster modules, and employs a control module to detect the base current of the transistor. When the output terminal of the level shifting module is short-circuited and the output current is increased significantly, the base current would exceed the current threshold, therefore triggering the cut down of the provision of the PWM signal, and as such achieving short-circuit protection. The liquid crystal panel is prevented from burning down due to the output short circuit, enhancing the reliability of the liquid crystal panel.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A Gate Driver on Array (GOA) short-circuit protection circuit, comprising a power module, a first booster module, a feedback module, a second booster module, and a control module; wherein the power module, the first booster module, the feedback module, and the second booster module are series-connected in the foregoing order; the control module is electrically connected to the first booster, feedback, and second booster modules, respectively; the power module provides a power voltage; the control module provides a pulse width modulation (PWM) signal so as to control the first and second booster modules to transform the power voltage into a driving voltage; the feedback module extracts a feedback current from a current flowing from the first to the second booster module and provides a feedback signal to the control module; when the feedback current exceeds a current threshold, the control module cuts off the provision of the PWM signal so as to achieve short-circuit protection.

2. The GOA short-circuit protection circuit according to claim 1, wherein the control module has a feedback signal input terminal; the feedback module comprises a transistor having a base, an emitter, and a collector; the base is electrically connected to the feedback signal input terminal; the emitter is electrically connected to the first booster module; and the collector is electrically connected to the second booster module.

3. The GOA short-circuit protection circuit according to claim 2, wherein the control module further has a PWM signal output terminal; the first booster module comprises a first diode, a second diode, a first capacitor, and a second capacitor; the first diode has its anode electrically connected to the power module and its cathode electrically connected to the second diode's anode; the second diode has its cathode electrically connected to the emitter; the first capacitor has a first terminal electrically connected to the cathode of the first diode and a second terminal electrically connected to the PWM signal output terminal; and the second capacitor has a first terminal electrically connected to the cathode of the second diode and a second terminal electrically connected to ground.

4. The GOA short-circuit protection circuit according to claim 3, wherein the second booster module comprises a third diode, a fourth diode, a third capacitor, a fourth capacitor, and a fifth capacitor; the third diode has its anode electrically connected to the collector and its cathode electrically connected to the fourth diode's anode; the third capacitor has a first terminal electrically connected to the collector and a second terminal electrically connected to ground; the fourth capacitor has a first terminal electrically connected the cathode of the third diode and a second terminal electrically connected to the PWM signal output terminal; and the fifth capacitor has a first terminal electrically connected to the cathode of the fourth diode and a second terminal electrically connected to ground.

5. The GOA short-circuit protection circuit according to claim 4, wherein the PWM signal has a high level state and a low level state; the high level state outputs a high level voltage and the low level state outputs a low level voltage zero; when the PWM signal is at the low level voltage, the first, second, third, and fourth diodes are all conducted, and the first to fifth capacitors are all charged to the power voltage.

6. The GOA short-circuit protection circuit according to claim 5, wherein, when the PWM signal is at the high level voltage, the first capacitor is charged to the high level voltage plus the power voltage, the first diode is turned off, the second diode is conducted, the second and third capacitors are charged to the high level voltage plus the power voltage, the third and fourth diodes are conducted, and the fourth and fifth capacitors are charged to the high level voltage plus the power voltage.

7. The GOA short-circuit protection circuit according to claim 6, wherein, when the PWM signal is at the low level voltage again, the first diode is conducted, the first capacitor drops to the power voltage, the second diode is turned off, the second, third, fourth, and fifth capacitors are maintained at the high level voltage plus the power voltage.

8. The GOA short-circuit protection circuit according to claim 7, wherein, when the PWM signal is at the high level voltage again, the first capacitor is charged to the high level voltage plus the power voltage, the first diode is turned off, the second diode is conducted, the second and third capacitors are maintained at the high level voltage plus the power voltage, the fourth capacitor is charged to the power voltage plus twice the high level voltage, the third diode is turned off, the fourth diode is conducted, and the fifth capacitor is charged to the power voltage plus twice the high level voltage.

9. The GOA short-circuit protection circuit according to claim 4, further comprising a level shifting module having an input terminal and an output terminal; wherein the input terminal is electrically connected to the cathode of the fourth diode; the level shifting module obtains a clock driving signal from the driving voltage and outputs the clock driving signal to the output terminal; when the output terminal is short-circuited, the current flowing through the first and second booster modules, and through the level shifting module is increased, and the feedback current is increased as well; when the control module detects that the feedback current exceeds the current threshold, the control module cuts down the provision of the PWM signal; and the first and second booster modules therefore enter a short-circuit protection mode.

10. A liquid crystal panel comprising a GOA short-circuit protection circuit, wherein the GOA short-circuit protection circuit comprises a power module, a first booster module, a feedback module, a second booster module, and a control module; the power module, the first booster module, the feedback module, and the second booster module are series-connected in the foregoing order; the control module is electrically connected to the first booster, feedback, and second booster modules, respectively; the power module provides a power voltage; the control module provides a PWM signal so as to control the first and second booster modules to transform the power voltage into a driving voltage; the feedback module extracts a feedback current from a current flowing from the first to the second booster module and provides a feedback signal to the control module; when the feedback current exceeds a current threshold, the control module cuts off the provision of the PWM signal so as to achieve short-circuit protection.

11. The liquid crystal panel according to claim 10, wherein the control module has a feedback signal input terminal; the feedback module comprises a transistor having a base, an emitter, and a collector; the base is electrically connected to the feedback signal input terminal; the emitter is electrically connected to the first booster module; and the collector is electrically connected to the second booster module.

12. The liquid crystal panel according to claim 11, wherein the control module further has a PWM signal output terminal; the first booster module comprises a first diode, a second diode, a first capacitor, and a second capacitor; the first diode has its anode electrically connected to the power module and its cathode electrically connected to the second diode's anode; the second diode has its cathode electrically connected to the emitter; the first capacitor has a first terminal electrically connected to the cathode of the first diode and a second terminal electrically connected to the PWM signal output terminal; and the second capacitor has a first terminal electrically connected to the cathode of the second diode and a second terminal electrically connected to ground.

13. The liquid crystal panel according to claim 12, wherein the second booster module comprises a third diode, a fourth diode, a third capacitor, a fourth capacitor, and a fifth capacitor; the third diode has its anode electrically connected to the collector and its cathode electrically connected to the fourth diode's anode; the third capacitor has a first terminal electrically connected to the collector and a second terminal electrically connected to ground; the fourth capacitor has a first terminal electrically connected the cathode of the third diode and a second terminal electrically connected to the PWM signal output terminal; and the fifth capacitor has a first terminal electrically connected to the cathode of the fourth diode and a second terminal electrically connected to ground.

14. The liquid crystal panel according to claim 13, wherein the PWM signal has a high level state and a low level state; the high level state outputs a high level voltage and the low level state outputs a low level voltage zero; when the PWM signal is at the low level voltage, the first, second, third, and fourth diodes are all conducted, and the first to fifth capacitors are all charged to the power voltage.

15. The liquid crystal panel according to claim 14, wherein, when the PWM signal is at the high level voltage, the first capacitor is charged to the high level voltage plus the power voltage, the first diode is turned off, the second diode is conducted, the second and third capacitors are charged to the high level voltage plus the power voltage, the third and fourth diodes are conducted, and the fourth and fifth capacitors are charged to the high level voltage plus the power voltage.

16. The liquid crystal panel according to claim 15, wherein, when the PWM signal is at the low level voltage again, the first diode is conducted, the first capacitor drops to the power voltage, the second diode is turned off, the second, third, fourth, and fifth capacitors are maintained at the high level voltage plus the power voltage.

17. The liquid crystal panel according to claim 16, wherein, when the PWM signal is at the high level voltage again, the first capacitor is charged to the high level voltage plus the power voltage, the first diode is turned off, the second diode is conducted, the second and third capacitors are maintained at the high level voltage plus the power voltage, the fourth capacitor is charged to the power voltage plus twice the high level voltage, the third diode is turned off, the fourth diode is conducted, and the fifth capacitor is charged to the power voltage plus twice the high level voltage.

18. The liquid crystal panel according to claim 13, wherein the GOA short-circuit protection circuit further comprises a level shifting module having an input terminal and an output terminal; the input terminal is electrically connected to the cathode of the fourth diode; the level shifting module obtains a clock driving signal from the driving voltage and outputs the clock driving signal to the output terminal; when the output terminal is short-circuited, the current flowing through the first and second booster modules, and through the level shifting module is increased, and the feedback current is increased as well; when the control module detects that the feedback current exceeds the current threshold, the control module cuts down the provision of the PWM signal; and the first and second booster modules therefore enter a short-circuit protection mode.

* * * * *